(12) United States Patent
Magara

(10) Patent No.: US 6,596,628 B2
(45) Date of Patent: Jul. 22, 2003

(54) ELECTRODE PAD IN SEMICONDUCTOR DEVICE AND METHOD OF PRODUCING THE SAME

(75) Inventor: Shinji Magara, Shiejiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/117,688

(22) Filed: Apr. 5, 2002

(65) Prior Publication Data

US 2002/0160607 A1 Oct. 31, 2002

(30) Foreign Application Priority Data

Apr. 6, 2001 (JP) ........................................ 2001-107953
Mar. 7, 2002 (JP) ........................................ 2002-062575

(51) Int. Cl.[7] ........................................ H01L 21/4763
(52) U.S. Cl. ........................ 438/637; 438/688; 438/745; 134/1.3
(58) Field of Search ................................ 438/637, 688, 438/745; 134/1.3

(56) References Cited

U.S. PATENT DOCUMENTS 5,380,401 A * 1/1995 Jones et al. ................. 156/665
5,451,291 A * 9/1995 Park et al. ................. 156/644.1
6,361,712 B1 * 3/2002 Honda et al. ............... 252/79.3
6,413,923 B2 * 7/2002 Honda et al. ............... 510/175
6,475,966 B1 * 11/2002 Sahbari ....................... 51/175

FOREIGN PATENT DOCUMENTS

KR         2001018260 A  *  3/2001  ........... H01L/21/28

* cited by examiner

Primary Examiner—T. N. Quach
(74) Attorney, Agent, or Firm—Harness, Dickey & Pierce, P.L.C.

(57) ABSTRACT

An electrode pad PAD, which is a layer 11 substantially made of aluminum to be connected to an internal conductive region, is formed on an interlayer insulation film 10 made of an $SiO_2$ layer or the like so as to be exposed in an opening portion of a passivation film 12 as the uppermost layer. For example, a bonding wire not shown in the drawing is connected to the electrode pad PAD. The exposed surface of the electrode pad PAD comprises a rough surface R roughened by means of an etching solution. Thereby, the surface of the electrode pad PAD has a substantially constant roughness, which increases the contact area for the bonding wire not shown in the drawing.

3 Claims, 3 Drawing Sheets

ELECTRODE PAD IN SEMICONDUCTOR DEVICE AND METHOD OF PRODUCING THE SAME

BACKGROUND OF THE INVENTION

1. Technical Field of the Invention

The present invention relates to formation of a pad for external connection in a semiconductor device, and more particularly, to an electrode pad in a semiconductor device to which a bonding wire is connected, and a method of producing the same.

2. Description of the Related Art

Regarding pads for external connection in semiconductor devices, an appropriate material needs to be selected for a wiring member, and an adequate size must be ensured so that electrical connection of bonding wires, bumps, or the like become highly stable, and moreover, the resistance is prevented from increasing. Furthermore, to prevent the pads from peeling off which may be caused by different types of stresses and impacts, the pads need to be formed using a material having a high adhesion property for an insulation layer as a base.

FIG. 3 is a cross-sectional view showing the configuration of a conventional electrode pad in a semiconductor device. Generally, the layer structure of a pad wiring connected to an internal conductive region not shown in the drawing is formed on an interlayer insulation film 30 comprising, e.g., a BPSG (boron-phosphorus silicide glass) film, an $SiO_2$ film, or the like and also, formed in an opening portion of the uppermost layer made of a passivation film 34.

Referring to an aluminum layer 33, a laminate comprising a Ti layer 31 and a TiN layer 32 as barrier metals is formed on the interlayer insulation film 30, and the layer 33 substantially made of aluminum is formed thereon. For example, the aluminum layer 33 has an AlCu structure which contains less than 1% of Cu (e.g., 0.5%).

For example, a bonding wire not shown in the drawing is connected to the electrode pad PAD comprising the aluminum layer 33 formed in the opening portion of the passivation film 34. The laminate comprising the Ti layer 31 and the TiN layer 32 is provided considering their adhesion properties and barrier properties for the base. The TiN layer 32 has a function of suppressing the Al of the aluminum layer 33 and the Si of an element from reacting with each other. Regarding the aluminum layer 33 and the Ti layer 31, reaction between the Al and the Ti is inhibited by the TiN layer 32 provided between them.

However, it is known that in the above-described configuration, the interlayer insulation film 30 made of an $SiO_2$ film or the like as the base and the Ti layer 31 react with each other to form a $TiO_2$ layer, which deteriorates the adhesion between them. Thus, in some cases, the Ti layer 31 and the TiN layer 32 are eliminated from the pad portion as a countermeasure for avoiding the configuration by which the strength of the pad is reduced. However, this countermeasure, that is, elimination of the barrier metals, is made only from the standpoint of the adhesion between the layers. Thus, there remains a danger that the bonding wire is released (reduction of the bond-lift strength).

In view of the above-described situations, the present invention has been devised, and an object of the present invention is to provide an electrode pad in a semiconductor device in which a countermeasure against the bond-lift defect on the pad surface is taken, and a method of producing the same.

SUMMARY OF THE INVENTION

The electrode pad in a semiconductor device according to the present invention, which is an end portion of a metallic wiring made of aluminum as a major component and formed on an insulation film of a semiconductor integrated circuit, is characterized in that the exposed surface of the metallic wiring having the periphery surrounded by a protective film comprises a rough surface roughened by means of an etching solution.

According to the electrode pad in a semiconductor device of the present invention, the exposed surface of the metallic wiring, that is, the pad surface is bleached with an etching solution to become a rough surface having a substantially constant roughness. This makes a contribution to enhancement of the adhesion of the bonding wire in contact with the pad.

The method of producing an electrode pad in a semiconductor device according to the present invention by which an end portion of a metallic wiring made of aluminum as a major component formed on an insulation film of a semiconductor integrated circuit is produced, comprises the steps of forming a protective film on the metallic wiring, dry-etching the protective film to form a pad opening so that at least the metallic wiring corresponding to a pad pattern is exposed, and cleaning the exposed surface of the metallic wiring present on the bottom of the pad opening by means of an etching solution. Characteristically, the etching solution is an amine type aqueous solution or a TMAH aqueous solution.

According to the method of producing an electrode pad in a semiconductor device of the present invention, when impurities remaining on the bottom of the pad opening are removed in the cleaning step carried out after the dry-etching step, the roughening of the exposed surface of the metallic wiring by means of an etching solution is also performed.

DETAILED DESCRIPTION OF THE PREFERRED EMBODIMENTS

Figure 1:
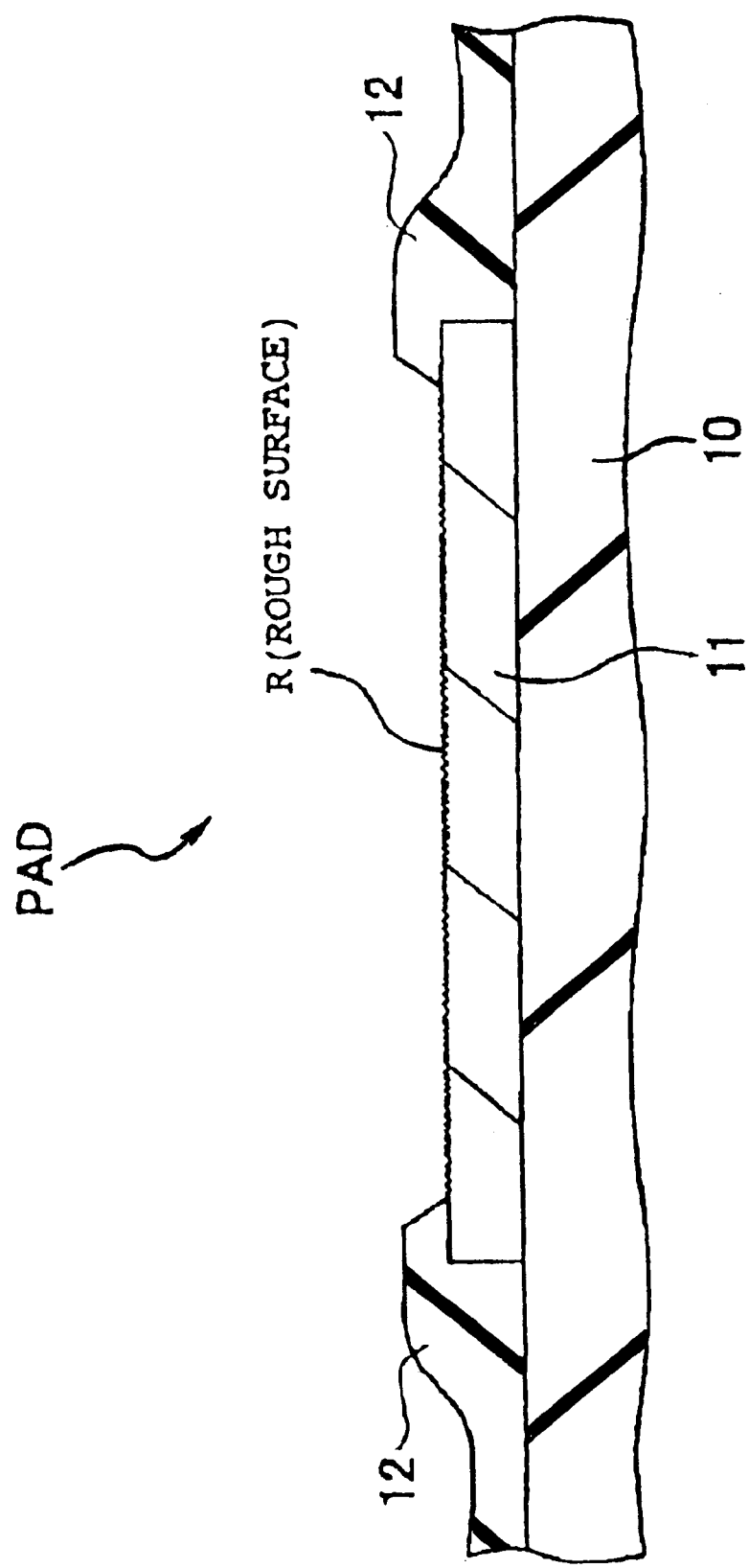
FIG. 1 is a cross-sectional view showing the configuration of an electrode in a semiconductor device according to an embodiment of the present invention.

FIG. 1 is a cross-sectional view showing the configuration of an electrode pad in a semiconductor device according to an embodiment of the present invention. The layer structure of the pad wiring connected to an internal conductive region not shown in the drawing is generally formed on an interlayer insulation film 10 comprising a BPSG (boron-phosphorus silicide glass) film, an $SiO_2$ film, or the like.

The end portion of a metallic wiring which is formed on the interlayer insulation film 10, e.g., made of an $SiO_2$ film, that is, an electrode pad PAD is configured in an opening portion of an uppermost passivation film 12. The electrode pad PAD comprises a layer 11 substantially made of aluminum. The aluminum layer has an Al-Cu structure, e.g., containing less than 1% of Cu (for example, 0.5%).

A laminate of a Ti layer and a TiN layer is formed as barrier metals on the base for the aluminum layer 11.

However, in the region where the electrode pad PAD is formed, the laminate of the Ti layer and the TiN layer is removed, and thereby, the adhesion between the aluminum layer 11 and the interlayer insulation film 10 is more enhanced.

For example, a bonding wire not shown in the drawing is connected to the electrode pad PAD. According to this embodiment, the exposed surface of the electrode pad PAD comprises a rough surface R formed by roughening using an etching solution. The rough surface R has a constant surface roughness of up to about 100 nm, caused by erosion in the grain boundary. Thus, the surface of the electrode pad PAD has a substantially constant surface roughness, and the contact area of the bonding wire is increased, making a contribution to enhancement of the adhesion.

Figure 2A:
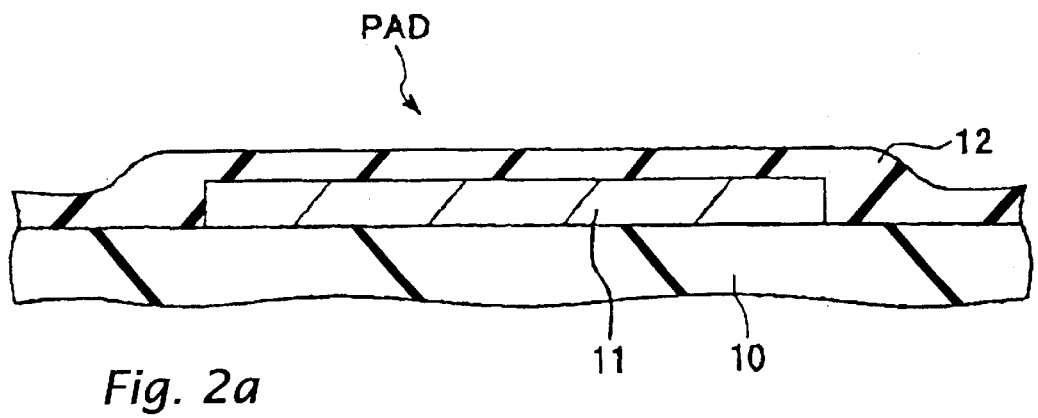
FIGS. 2(*a*) to 2(*c*) consists of cross-sectional views showing in the order of processes a method of producing the electrode pad in a semiconductor device having the configuration of FIG. 1.
Figure 2B:
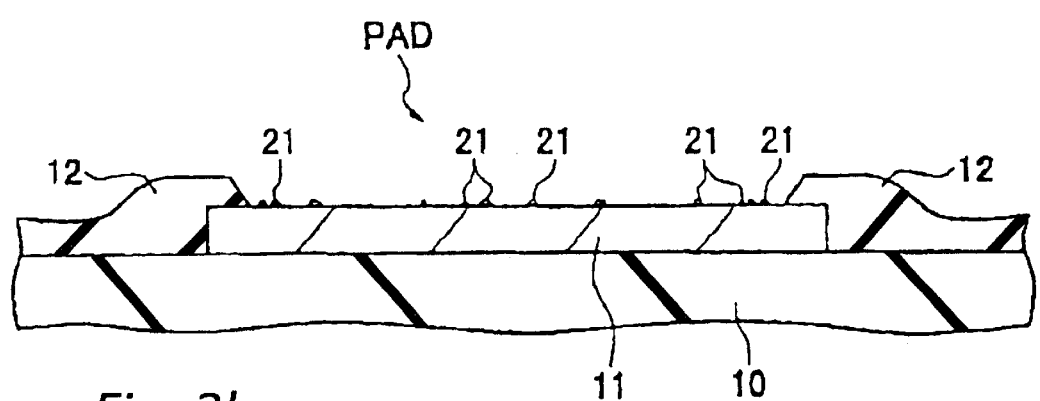
Figure 2C:
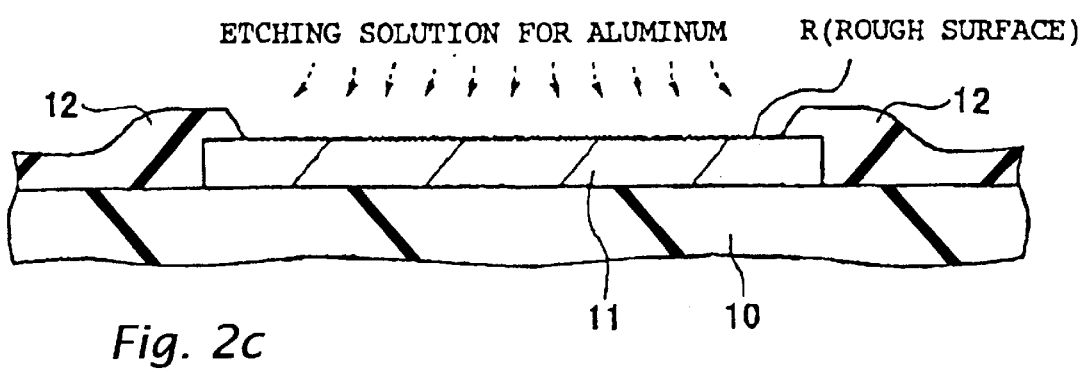
Figure 3:
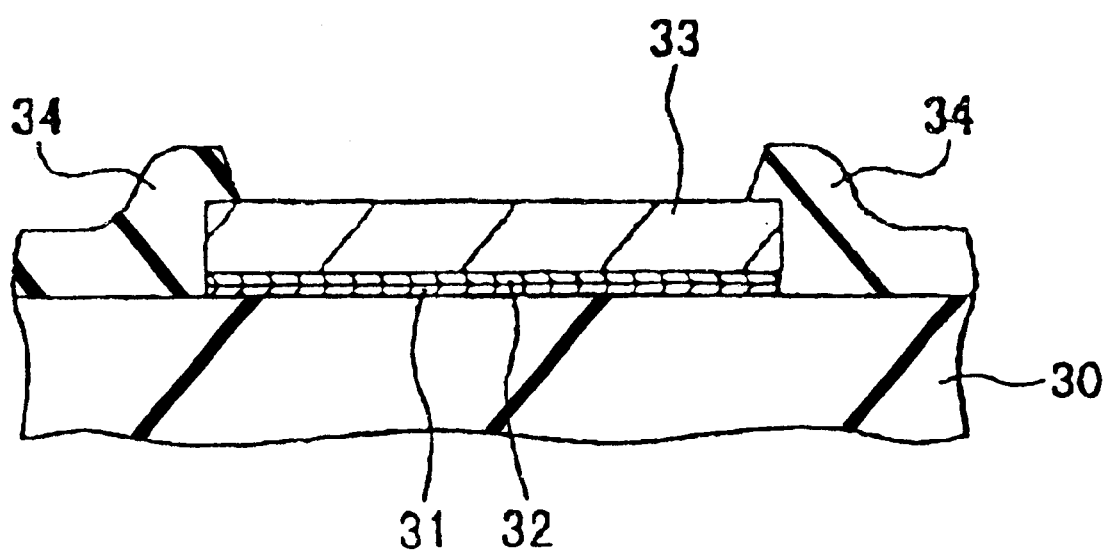
FIG. 3 is a cross-sectional view showing the configuration of a conventional electrode pad in a semiconductor device.

FIGS. 2(a) to (c) consists of cross-sectional views illustrating, in the order of processes, the essential part of a method of producing the electrode pad in a semiconductor device having the configuration of FIG. 1. The essential part of the method will be described below. The similar parts as those of FIG. 1 are designated by the same reference numerals.

As shown in FIG. 2(a), for example, the end portion of the aluminum layer 11 to be connected to the internal conductive region not shown in the drawing, that is, the electrode pad PAD is formed on the interlayer insulation film 10 comprising an $SiO_2$ film or the like. The barrier metal (for example, laminate of Ti and TiN) present on the electrode pad PAD region is selectively removed prior to the formation of the aluminum layer 11. Thereafter, the passivation film 12 is formed on the aluminum layer 11, covering the electrode pad PAD region.

Next, as shown in FIG. 2(b), an opening is selectively formed in the passivation film 12 corresponding to a pad pattern by dry etching. In this case, impurities 21 such as reaction components of gas species used in the dry etching and etching-residual films are scattered on the bottom of the pad opening.

Next, as shown in FIG. 2(c), a cleaning process is carried out to eliminate the impurities 21. In this cleaning process, the exposed surface of the aluminum layer 11 present on the bottom of the pad opening is dipped into an amine type aqueous solution or polymer-removing cleaning agent so that the surface can be slightly etched, for example, into an aqueous solution containing several % of TMAH (tetra methyl ammonium hydroxide (developer) for an appropriate time. Thereby, the exposed surface of the aluminum layer 11, that is, the electrode pad PAD is cleaned, and also, the rough surface R having an optional substantially constant roughness (about up to 100 nm, caused by erosion in the grain boundary) is formed on the surface of the electrode pad PAD.

According to the method of the above-described embodiment, the process of roughening the exposed surface of the metallic wiring using an etching solution can be performed by utilization of the cleaning process of eliminating the impurities 21 remaining on the bottom of the pad opening after the dry etching process.

As described above, the surface of the electrode pad in a semiconductor device is roughened so as to have a substantially constant roughness, and thereby, the contact area of the bonding wire (or a bump electrode) to be connected thereto is increased, and the adhesion between them is enhanced. Thus, the connection of the bonding wire becomes durable to impact and peeling. In the above-described respective embodiments, no barrier metal is formed under the wiring layer of the electrode pad. The barrier metal may be left, not selectively-removed, provided that a sufficient strength of adhesion between the layers can be obtained.

As described above, according to the present invention, the surface of the electrode pad is bleached using the etching solution to become a rough surface having a substantially constant roughness. As a result, the electrode pad in a semiconductor device in which a countermeasure against a bond-lift defect is taken for the surface of the pad, and a method of producing the same can be provided. The entire disclosures of Japanese Patent Application Nos. 2001-107953 filed Apr. 6, 2001 and 2002-62575 filed Mar. 7, 2002 are incorporated by reference.

What is claimed is:

1. A method of producing an electrode pad in a semiconductor device by which an end portion of a metallic wiring made of aluminum as a major component formed on an insulation film of a semiconductor integrated circuit is produced, comprising the steps of:

forming a protective film on the metallic wiring;

dry-etching the protective film to form a pad opening so that the metallic wiring corresponding to at least a pad pattern is exposed; and simultaneously cleaning and roughing the surface of metallic wiring by etching solution.

2. The method of producing an electrode pad in a semiconductor device of claim 1, wherein the etching solution is one of an amine aqueous solution and a TMAH aqueous solution.

3. A method of producing an electrode pad in a semiconductor device by which an end portion of a metallic wiring made of aluminum as a major component formed on an insulation film of a semiconductor integrated circuit is produced, comprising the steps of:

forming a protective film on the metallic wiring;

dry-etching the protective film to form a pad opening so that the metallic wiring corresponding to at least a pad pattern is exposed; and simultaneously cleaning and roughing the surface of metallic wiring to have a roughness less than 100 nm by etching solution.

* * * * *